(12) United States Patent
Yu et al.

(10) Patent No.: US 11,589,466 B2
(45) Date of Patent: Feb. 21, 2023

(54) DISPLAY DEVICE

(71) Applicant: LG Display Co., Ltd., Seoul (KR)

(72) Inventors: JaeHui Yu, Iksan-si (KR); Homin Lee, Paju-si (KR); ByungChang Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 4 days.

(21) Appl. No.: 17/323,385

(22) Filed: May 18, 2021

(65) Prior Publication Data

US 2021/0274663 A1    Sep. 2, 2021

Related U.S. Application Data

(62) Division of application No. 16/164,617, filed on Oct. 18, 2018, now Pat. No. 11,044,820.

(30) Foreign Application Priority Data

Oct. 30, 2017  (KR) ......................... 10-2017-0142414
Jun. 14, 2018  (KR) ......................... 10-2018-0068271

(51) Int. Cl.
   *H05K 5/00*      (2006.01)
   *H05K 5/03*      (2006.01)
   (Continued)

(52) U.S. Cl.
   CPC ..... *H05K 5/0017* (2013.01); *G02F 1/133308* (2013.01); *H01L 51/529* (2013.01);
   (Continued)

(58) Field of Classification Search
   CPC ........ H05K 5/0017; H05K 1/189; H05K 5/03; H05K 2201/10128; G02F 1/133308;
   (Continued)

(56) References Cited

U.S. PATENT DOCUMENTS 9,553,282 B2    1/2017  Shin et al.
9,999,152 B2    6/2018  Kang et al.
(Continued)

FOREIGN PATENT DOCUMENTS

CN    101150901 A    3/2008
CN    101738785 A    6/2010
(Continued)

OTHER PUBLICATIONS

China National Intellectual Property Administration, Office Action, CN Patent Application No. 201811220309.6, dated Mar. 31, 2021, 20 pages.
(Continued)

*Primary Examiner* — Binh B Tran
(74) *Attorney, Agent, or Firm* — Fenwick & West LLP

(57) ABSTRACT

A display device may comprise a display panel, a back cover including a first supporting unit which supports a rear surface of the display panel and a second supporting unit which extends from an edge of the first supporting unit to be bent in a vertical direction and is spaced apart from an edge of the display panel and a plate disposed between a front surface of the first supporting unit and the display panel and bonded to the first supporting unit at a position spaced apart from the second supporting unit.

6 Claims, 6 Drawing Sheets

(51) Int. Cl.
*H01L 51/52* (2006.01)
*H05K 1/18* (2006.01)
*G02F 1/1333* (2006.01)
*H01L 27/32* (2006.01)

(52) U.S. Cl.
CPC ...... *H01L 51/5237* (2013.01); *H01L 51/5246* (2013.01); *H05K 1/189* (2013.01); *H05K 5/03* (2013.01); *G02F 1/133314* (2021.01); *G02F 1/133385* (2013.01); *H01L 27/3276* (2013.01); *H05K 2201/10128* (2013.01)

(58) Field of Classification Search
CPC ... G02F 1/133385; G02F 2001/133314; H01L 51/5246; H01L 51/5237; H01L 51/529; H01L 27/3276
USPC ......................................................... 361/748
See application file for complete search history.

(56) References Cited

U.S. PATENT DOCUMENTS

| | | |
|---|---|---|
| 2008/0067933 A1 | 3/2008 | Wang et al. |
| 2009/0004408 A1* | 1/2009 | Nakanishi ......... G02F 1/133308 428/12 |
| 2009/0067112 A1 | 3/2009 | Takabayashi |
| 2010/0118226 A1 | 5/2010 | Kim |
| 2013/0300975 A1 | 11/2013 | Suzuki |
| 2015/0340646 A1* | 11/2015 | Shin .................... H01L 51/5237 257/40 |
| 2017/0052302 A1 | 2/2017 | Lee et al. |
| 2017/0118859 A1* | 4/2017 | Kang .................. H05K 7/1427 |
| 2021/0013450 A1 | 1/2021 | Wang |

FOREIGN PATENT DOCUMENTS

| | | |
|---|---|---|
| CN | 105097871 A | 11/2015 |
| CN | 106920479 A | 7/2017 |
| CN | 107104203 A | 8/2017 |
| KR | 10-2015-0134142 A | 12/2015 |
| KR | 10-2016-0110834 A | 9/2016 |
| KR | 10-2017-0021972 A | 3/2017 |
| KR | 10-2017-0050289 A | 5/2017 |
| KR | 10-2017-0080316 A | 7/2017 |

OTHER PUBLICATIONS

United States Office Action, U.S. Appl. No. 16/164,617, dated Nov. 2, 2020, eight pages.

* cited by examiner

DISPLAY DEVICE

CROSS-REFERENCE TO RELATED APPLICATIONS

This application is a divisional of U.S. patent application Ser. No. 16/164,617 filed on Oct. 18, 2018 which claims priority to Republic of Korea Patent Application No. 10-2017-0142414 filed on Oct. 30, 2017 and Republic of Korea Patent Application No. 10-2018-0068271 filed on Jun. 14, 2018 with the Korean Intellectual Property Office, each of which are hereby incorporated herein by reference in their entirety.

BACKGROUND

Field of Technology

The present disclosure relates to a display device, and more particularly, to a display device including a back cover having enhanced rigidity.

Description of the Related Art

Recently, as it enters an information era, a display field which visually expresses electrical information signals has been rapidly developed and in response to this, various display devices having excellent performances such as thin-thickness, light weight, and low power consumption have been developed. An example of the display device may include a liquid crystal display device (LCD), a field emission display device (FED), an electro-wetting display device (EWD), and an organic light emitting display device (OLED).

Such display devices include a display panel which displays images, a back cover which accommodates the display panel and forms an outer appearance of the display device, a printed circuit board which transmits a data signal and a driving control signal input from the outside to the display panel, and a flexible printed circuit board (FPC) which is disposed between the display panel and the printed circuit board to electrically connect the display panel and the printed circuit board to each other.

In the meantime, in order to support the display panel and enhance the rigidity of the display device, typical display devices further include a separate reinforcing member and a middle cabinet.

However, the separate reinforcing member and the middle cabinet may cause a problem in that the number of components which configure the display device is increased, a cost and a manufacturing process are increased, and an assembly becomes complex.

SUMMARY

An object to be achieved by the present disclosure is to provide a display device in which the number of entire components of the display device is reduced by omitting a reinforcing member and a middle cabinet and a cost, a manufacturing process, and an assembly are simplified.

Another object to be achieved by the present disclosure is to provide a display device which enhances a rigidity of the display device and improves a heat dissipation performance of a display device even though the reinforcing member and the middle cabinet are omitted.

Still another object to the achieved by the present disclosure is to provide a display device which improves an exterior design of a display device by planarizing an exterior appearance of a back cover.

An object to be achieved by the present disclosure is to provide a display device which improves a design of a back cover to avoid interference of circuit components disposed in a display panel.

According to an aspect of the present disclosure, a display device may include a display panel, a back cover including a first supporting unit which supports a rear surface of the display panel and a second supporting unit which extends from an edge of the first supporting unit to be bent in a vertical direction and is spaced apart from an edge of the display panel, and a plate disposed between a front surface of the first supporting unit and the display panel and bonded to the first supporting unit at a position spaced apart from the second supporting unit. Therefore, the display device according to the aspect of the present disclosure includes a plate including a core layer and a metal layer between a display panel and a back cover so that the rigidity of the display device may be enhanced even though the middle cabinet and the reinforcing member are not provided.

According to another aspect of the present disclosure, a display device may include a display panel in which a plurality of pixels are disposed, a printed circuit board bonded to a rear surface of the display panel, a back cover including a first supporting unit which supports a rear surface of the display panel and a second supporting unit which extends from an end of the first supporting unit to be bent in a vertical direction and spaced apart from an edge of the display panel, and a plate between the display panel and the back cover, in which the plate includes a groove formed in a position corresponding to an area where the printed circuit board is disposed. Therefore, in the display device according to another aspect of the present disclosure, a partial area of the plate corresponding to the printed circuit board is removed to form a groove and the printed circuit board is disposed in the groove so that a shape of the back cover does not need to be changed while enhancing the rigidity of the display device, thereby suppressing the degradation of the design quality of the display device.

According to the present disclosure, a core layer which is formed of a plastic resin and a metal layer made of the same material as a back cover are disposed between a display panel and the back cover to omit a reinforcing member and a middle cabinet, thereby reducing the number of entire components of the display device and simplifying a cost, a manufacturing process, and an assembly.

According to the present disclosure, a part of a plate is removed from an area corresponding to an area where a printed circuit board is disposed to form a groove which is a circuit evasion area so that there is no need to change an exterior appearance of the back cover, thereby suppressing the degradation of an exterior design of the display device.

The effects according to the present disclosure are not limited by the contents exemplified above, and more various effects are included in the specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
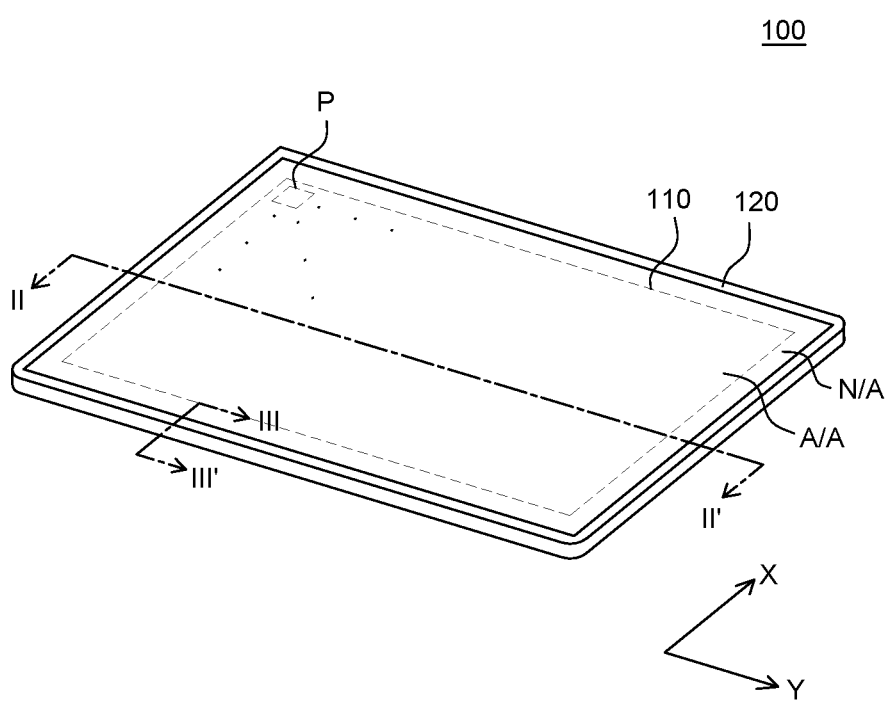
FIG. 1 is a perspective view schematically illustrating a display device according to an exemplary embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly". It is to be understood that an element or layer is referred to as being "on" another element or layer, including either intervening layers or other elements directly on or in between. When an element is described as being "coupled" or "connected" to another element, the element may be directly coupled or connected to the other element. However, it should be understood that other elements may be "interposed" between the two elements, or each element may be "coupled" or "connected" through another element.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

The sizes and thicknesses of the individual components shown in the drawings are shown merely for convenience of explanation and the present disclosure is not necessarily limited to the size and thickness of the components shown in the drawings.

Each of the features of the various embodiments of the present disclosure can be combined with each other partly or entirely. The features of the various embodiments can be technically interlocked and driven as well. The features of the various embodiments can be practiced independently or in conjunction with each other.

Hereinafter, the present disclosure will be described with reference to the accompanying drawings.

FIG. 1 is a perspective view schematically illustrating a display device according to an exemplary embodiment of the present disclosure.

Referring to FIG. 1, a display device 100 according to an exemplary embodiment of the present disclosure includes a display panel 110 and a back cover 120 which supports a rear surface of the display panel 110 and forms an exterior appearance of the display device 100.

The display panel 110 includes a display area A/A where images are displayed and a non-display area N/A which is disposed to enclose the display area A/A In the display area A/A of the display panel 110, a plurality of gate lines (not illustrated) and a plurality of data lines (not illustrated) are disposed and a plurality of pixels P which displays images by a gate signal and a data signal transmitted through the plurality of gate lines and the plurality of data lines is provided.

In the non-display area N/A of the display panel 110, a gate driving circuit (not illustrated) which applies a gate signal to the gate lines disposed in the display area A/A and a data driving circuit which applies a data signal to the data lines disposed in the display area A/A are disposed.

The gate driving circuit is disposed in the non-display area N/A which is disposed on both sides of the display area A/A in a first direction X. The gate driving circuit may be connected to a bonding pad of the display panel 110 by a tape automated bonding (TAB) manner, a chip on glass (COG), or a chip on film (COF) manner or may be directly disposed on the display panel 110 by a gate in panel (GIP) manner.

The data driving circuit is disposed on any one of sides of the display area A/A in a second direction Y which is different from the first direction X and may be disposed as a driving circuit chip on a base film of a flexible printed circuit board. That is, the data driving circuit may be disposed by a chip of film (COF) manner. Even though it is described that the data driving circuit is disposed by the chip on film manner in the exemplary embodiment of the present disclosure, it is not limited thereto and the data driving circuit may be disposed by a tape automated bonding (TAB) manner or a chip on glass (COG) manner.

The back cover 120 supports a rear surface of the display panel 110 while accommodating the display panel 110. In this case, a height of a side supporting unit which forms a side of the back cover 120 may be higher than a height of a side of the display panel 110. Further, the back cover 120 according to the exemplary embodiment of the present disclosure may have a hemming structure in which a side edge is curved toward an inside direction which is a direction where the display panel 110 is disposed or an outside direction in order to protect the display panel 110 and enhance a rigidity of the display device 100. A detailed structure of the back cover 120 will be described in more detail with reference to FIGS. 2A to 2F.

In the meantime, the display panel 110 according to the exemplary embodiment of the present disclosure may be any one of various display panels such as an organic light emitting display panel, a liquid crystal display panel, a field emission display panel, and an electro-wetting display panel. Hereinafter, it will be described that the display panel 110 according to the exemplary embodiment of the present disclosure is an organic light emitting display panel as an example.

A normal display device includes a reinforcing member which enhances the rigidity of the display device and a rectangular frame-shaped middle cabinet to enclose side edges of the display panel, between the display panel and the back cover. In the case of the reinforcing member, when the printed circuit board is disposed to be tilted to the rear surface of the display panel, in order to avoid the printed circuit board, a shape of the back cover needs to be changed. In this case, the exterior characteristic of the display device is deteriorated and inconvenience of the user may be caused. Further, the middle cabinet has an advantage in that the middle cabinet is disposed to enclose the display panel to suppress a damage of the display panel due to an external impact, but the number of components which configure the display device is undesirably increased. Therefore, in the display device according to the exemplary embodiment of the present disclosure, even though the middle cabinet and the reinforcing member are omitted, the rigidity of the display device may be enforced and an exterior design characteristic of the display device may be improved. To this end, the display device 100 according to the exemplary embodiment of the present disclosure may further include a plate 130 which improves a shape of the back cover 120 and is disposed between the display panel 110 and the back cover 120. A shape of the back cover and the plate described above will be described in more detail with reference to FIGS. 2A to 2F.

FIGS. 2A to 2F are cross-sectional views schematically illustrating several examples of a display device taken along the line II-II' of FIG. 1. More specifically, FIGS. 2A to 2F are cross-sectional views illustrating a structure of a non-display area of a display device taken along the line II-II' of FIG. 1.

Referring to FIGS. 2A to 2F, the display device 100 according to the exemplary embodiment of the present disclosure includes a display panel 110, a back cover 120, and a plate 130.

The display panel 110 includes a display area A/A where a plurality of pixels is disposed to display images and a non-display area N/A disposed at an outer periphery of the display area AA where a driving element for driving the plurality of pixels is disposed.

In the display area A/A of the display panel 110, the plurality of pixels is disposed and each pixel may be an organic light emitting diode. Even though not illustrated, in each pixel, a switching transistor, a driving transistor, and at least one capacitor may be further disposed to drive the organic light emitting diode. The organic light emitting diode includes a first electrode which is supplied with a current from a driving transistor (not illustrated) disposed for every pixel, a second electrode corresponding to the first electrode, and a light emitting layer disposed between the first electrode and the second electrode. In the organic light emitting diode, when holes are injected from the first electrode to the light emitting layer and electrons are injected from the second electrode to the light emitting layer, the holes and electrons are coupled to each other in the light emitting layer and excitons are formed by the coupling to emit light.

A polarizing film 111 is disposed on a front surface of the display panel 110.

A sealing member 112 is disposed on the sides of the display panel 110 to suppress light leakage that light emitted from each pixel is emitted through the sides. In this case, the sealing member 112 may be formed of a polymer material containing a black pigment to absorb light emitted from the pixel arrangement so that light emitted through the sides of the display panel 110 is not seen.

An encapsulation member 113 may be disposed on a rear surface of the display panel 110. When the organic light emitting diode is exposed to the moisture or oxygen, the pixel may be deteriorated. Therefore, the encapsulation member 113 is disposed to suppress the deterioration of the pixel.

Figure 2A:
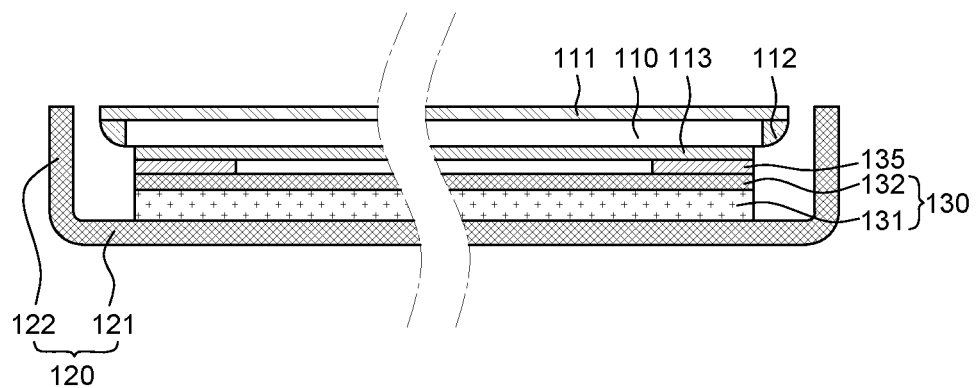
FIGS. 2A to 2F are cross-sectional views schematically illustrating several examples of a display device taken along the line II-II' of FIG. 1 according to an embodiment of the present disclosure.

As illustrated in FIG. 2A, the back cover 120 includes a first supporting unit 121 which supports a rear surface of the display panel 110 and a second supporting unit 122 which extends to be bent in a vertical direction from the first supporting unit 121 and is spaced apart from an edge of the display panel 110. The back cover 120 may be formed of a metal material such as aluminum, aluminum alloy, stainless steel, or electro galvanized steel. In the exemplary embodiment of the present disclosure, it is described that the back cover 120 is formed of a metal material such as aluminum, aluminum alloy, stainless steel, or electro galvanized steel, but it is not limited thereto. Therefore, as long as the second supporting unit 122 of the back cover 120 can be bent with a predetermined curvature, any other material in addition to the above-mentioned material may be also used.

The plate 130 is disposed between a rear surface of the display panel 110 and a front surface of the first supporting unit 121 of the back cover 120. The plate 130 may include a core layer 131 disposed on a front surface of the first supporting unit 121 and a metal layer 132 disposed on the core layer 131 and the display panel 110. Therefore, the display device 100 according to the exemplary embodiment of the present disclosure includes the plate 130 formed by laminating the core layer 131 and the metal layer 132 between the display panel 110 and the back cover 120 so that the rigidity of the overall back cover 120 is improved. Further, the second supporting unit 122 of the back cover 120 is freely bent so that a physical impact from the outside may be absorbed while improving an exterior appearance of the edge of the display device 100.

The core layer 131 may include a plastic resin and as the plastic resin, engineering plastic resin such as polyester resin, polyimide resin, or epoxy resin may be used. Further, the core layer 131 may include any one or more of a carbon fiber, a silicon carbide fiber, an aramid fiber, and a boron fiber. The core layer 131 is formed by combining any one or more of a carbon fiber, a silicon carbide fiber, an aramid fiber, and a boron fiber with plastic resin so that when the plastic resin is cured, the metal layer 132 and the first supporting unit 121 are coupled to each other. That is, the core layer 131 has adhesiveness. Further, the core layer 131 is formed by combining any one or more of a carbon fiber, a silicon carbide fiber, an aramid fiber, and a boron fiber with plastic resin so that the elasticity is increased and the strength is increased by the fibers which are combined with the plastic resin.

A thickness of the core layer 131 may be greater than the thicknesses of the first supporting unit 121 of the back cover 120 and the metal layer 132. Generally, the plastic resin which forms the core layer 131 is cheaper than the metal material which forms the first supporting unit 121 and the metal layer 132. Therefore, by making the thickness of the core layer 131 greater than the thicknesses of the first supporting unit 121 of the back cover 120 and the metal layer 132, the rigidity of the display device 100 may be enhanced at a lower price.

The metal layer 132 may be formed of the same material as the back cover 120, such as aluminum, aluminum alloy, stainless steel, or electro galvanized steel. As described above, the metal layer 132 is disposed to be adjacent to the display panel 110 so that high heat generated from the display panel 110 may be dissipated. Further, the back cover 120 and the metal layer 132 are formed of the same metal material so that the heat generated in the display panel 110 may be rapidly and efficiently dissipated.

The plate 130 may be formed on the first supporting unit 121 of the back cover 120 by various methods.

For example, the core layer 131 is applied only on the first supporting unit 121 excepting the area of the second supporting unit 122, on the front surface of the flat panel-shaped back cover 120 and the metal layer 132 is formed on the core layer 131 to bond the back cover 120 and the plate 130. In this case, a jig which occupies a space is provided in advance so that the core layer 131 is not applied in the area of the second supporting unit 122 of the back cover 120 and the core layer 131 is applied only in the area of the first supporting unit 121 which is the remaining area and the metal layer 132 is formed on the core layer 131. Therefore, by doing this, the plate 130 may be bonded to the back cover 120.

As another example, after bonding the metal layer 132 by applying the core layer 131 on the entire area of the back cover 120, the core layer 131 and the metal layer 132 of the plate 130 are cut only in the area of the second supporting unit 122 and the plate 130 may be provided only in the area of the first supporting unit 121.

As the method for forming the plate 130 including the core layer 131 and the metal layer 132 on the back cover 120, various methods may be used in addition to the above-described method. When the operation of forming the plate 130 is completed, the second supporting unit 122 of the back cover 120 is bent and the display panel 110 is seated so that the display device 100 according to the exemplary embodiment of the present disclosure will be completed.

Further, the adhesive member 135 is provided between the rear surface of the display panel 110 and the plate 130 so that the display panel 110 and the plate 130 are firmly coupled, thereby suppressing the display panel 110 from being slipped.

Figure 2B:
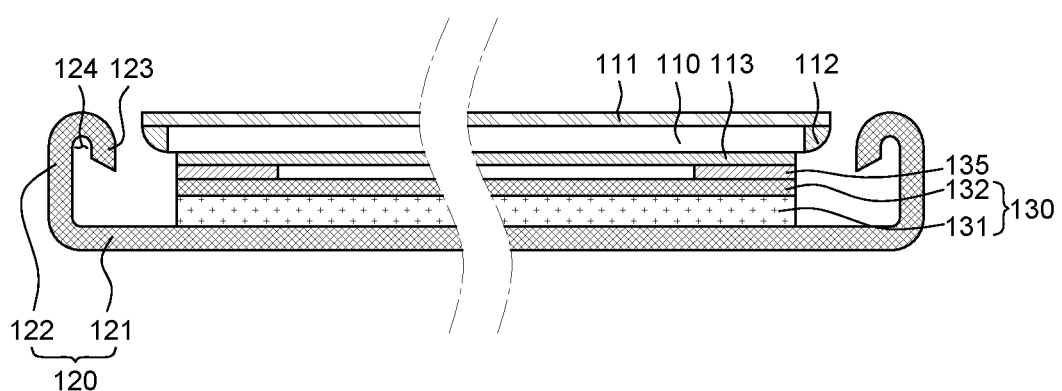

As illustrated in FIG. 2B, the back cover 120 of the display device 100 according to the exemplary embodiment of the present disclosure may further include a bent edge 123 which is bent from an end of the second supporting unit 122 toward the edge of the display panel 110. That is, the back cover 120 may have a hemming structure in which the end of the second supporting unit 122 is bent toward the inward direction where the display panel 110 is disposed. As described above, the back cover 120 of the display device 100 according to the exemplary embodiment of the present disclosure further includes a bent edge 123 extending from the end of the second supporting unit 122, so that the side of the display device 100 has a double laminated structure and the rigidity is further increased. Therefore, in the display device 100 according to the exemplary embodiment of the present disclosure, even though a physical impact is applied to the side, the impact may be relieved.

In the meantime, as illustrated in FIG. 2B, a space 124 may be provided between the second supporting unit 122 and the bent edge 123. The space 124 is provided as described above, so that when the physical impact is applied to the second supporting unit 122, the second supporting unit 122 may be deformed through the space 124 and the deformation may suppress the bent edge 123 from colliding with the edge of the display panel 110.

Further, when the display device 100 collides with other objects while being moved, the impact and the vibration which may be applied to the display device 100 may be relieved by the space 124 between the second supporting unit 122 and the bent edge 123.

Figure 2C:
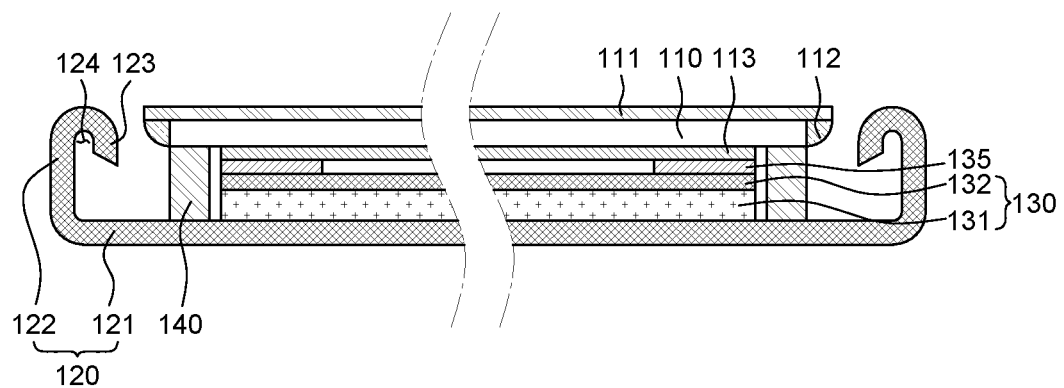

As illustrated in FIG. 2C, the display device 100 according to the exemplary embodiment of the present disclosure may further include an absorbing member 140. The absorbing member 140 may be disposed between the plate 130 and the second supporting unit 122 to be in contact with the first supporting unit 121 of the back cover 120 and the rear surface of the display panel 110. As described above, the display device 100 according to the exemplary embodiment of the present disclosure further includes the absorbing member 140 so that when moisture enters between the edge of the display panel 110 and the bent edge 123 by a cleaning agent or a spray, the absorbing member 140 absorbs the moisture first. Therefore, the damage of various circuit components disposed on the rear surface of the display panel 110 may be avoided.

Figure 2D:
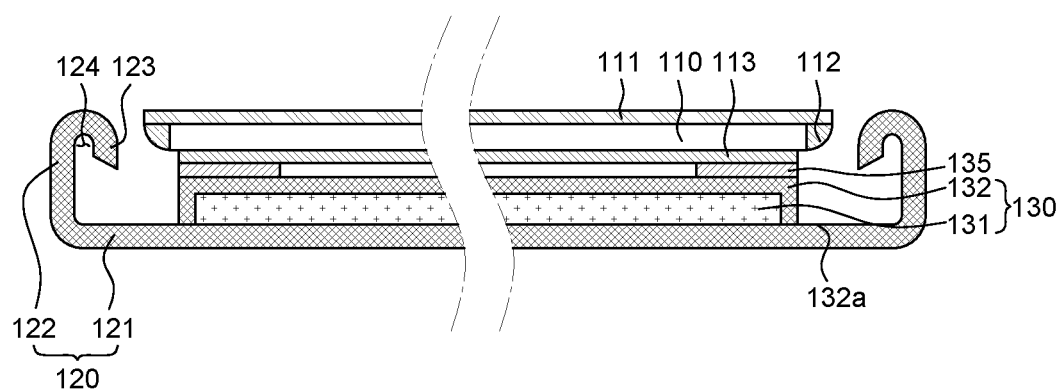

Further, as illustrated in FIG. 2D, the plate 130 of the display device 100 according to the exemplary embodiment of the present disclosure may further include a supporting edge 132a which is formed by vertically bending both edges of the metal layer 132 to be supported by the front surface of the first supporting unit 121 while enclosing the side of the core layer 131. That is, in FIGS. 2B and 2C, the core layer 131 and the metal layer 132 are disposed to have the same width, but in FIG. 2D, the metal layer 132 is disposed to have a larger width than that of the core layer 131 so that the metal layer 132 may enclose the side of the core layer 131.

In the display device 100 according to the exemplary embodiment of the present disclosure, a supporting force which supports in the vertical direction in which the display panel 110 and the back cover 120 are laminated is increased due to the supporting edge 132. Therefore, even though the physical impact is applied to the rear surface of the back cover 120, the deformation of the back cover 120 is reduced and the deformation or damage of the display panel 110 is also reduced.

Figure 2E:
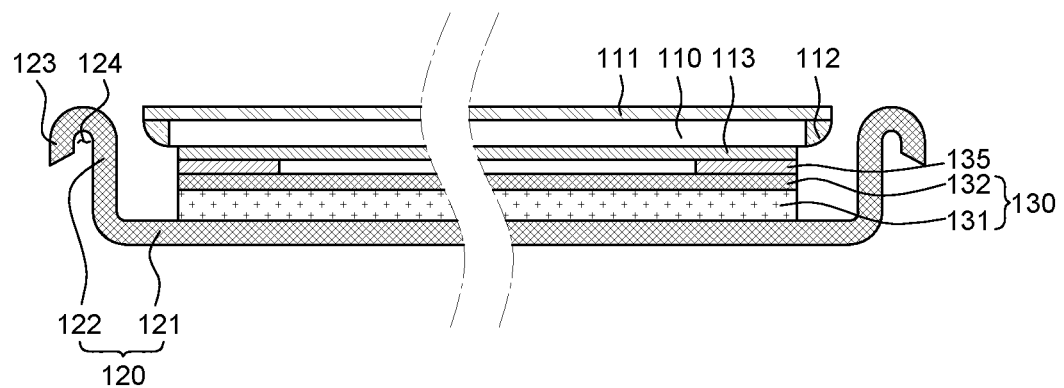
Figure 2F:
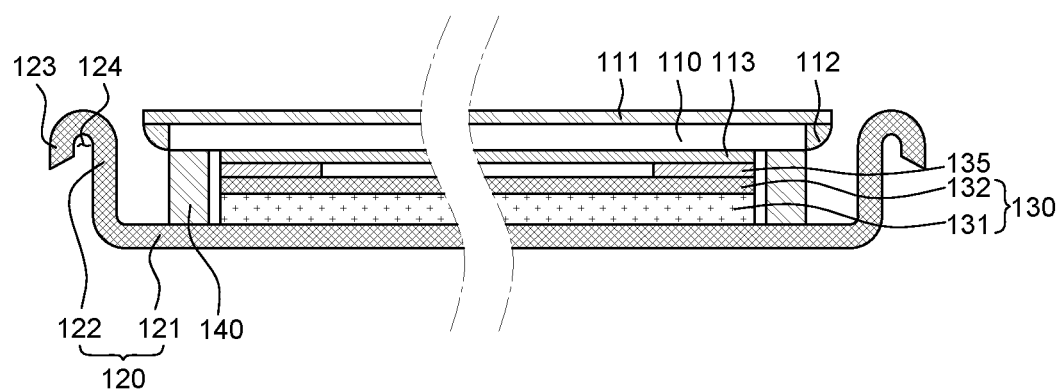

Further, as illustrated in FIGS. 2E and 2F, the bent edge 123 of the display device 100 according to the exemplary embodiment of the present disclosure may be bent at the end of the second supporting unit 122 to be opposite to a direction in which the display panel 110 is disposed. That is, as illustrated in FIGS. 2E and 2F, the bent edge 123 may be bent to the outward direction of the display panel 110 at the end of the second supporting unit 122.

That is, the bending direction of the bent edge 123 according to the exemplary embodiment illustrated in FIGS. 2E and 2F is opposite to the bending direction of FIGS. 2B to 2D. Therefore, when an impact load is applied from the side to the display device 100, the bent edge 123 is deformed first to absorb the impact. That is, in the exemplary embodiment of FIGS. 2B to 2D, the second supporting unit 122 is located outside the bent edge 123 so that the second supporting unit 122 may have scratches due to the physical impact so that the quality of the exterior appearance may be degraded. In contrast, in the exemplary embodiment of FIGS. 2E and 2F, the bent edge 123 is provided in a position which outwardly protrudes from the second supporting unit 122 so that when the display device collides with an external object, the bent edge 123 collides first and then is deformed to be bent. Therefore, the frequency of scratches may be reduced.

Further, as illustrated in FIGS. 2E and 2F, even when the bent edge 123 is bent to be opposite to an edge of the display panel 110, the space 124 may be provided between the second supporting unit 122 and the bent edge 123. As described above, even though the bent edge 123 is bent to be opposite to the edge of the display panel 110, the space 124 is provided between the back cover 120 and the bent edge 123. Therefore, when the physical impact is applied to the bent edge 123, the bent edge 123 is deformed through the space 124 so that the impact may be relieved.

Further, as illustrated in FIG. 2F, when the bent edge 123 is bent to be opposite to the edge of the display panel 110, the absorbing member 140 which is attached to the rear surface of the display panel 110 and the first supporting unit 121 may be further provided between the plate 130 and the second supporting unit 122. As described above, the absorbing member 140 is further provided to absorb moisture entering between the edge of the display panel 110 and the second supporting unit 122 so that damages of various circuit components disposed on the rear surface of the display panel 110 may be avoided.

As described above, in the display device 100 according to the exemplary embodiment of the present disclosure, the plate 130 formed of the core layer 131 including a plastic resin and the metal layer 132 is bonded onto the first supporting unit 121 of the back cover 120 which supports the display panel 110. Therefore, even though the middle cabinet and the reinforcing member are omitted, the rigidity of the overall back cover 120 is maintained. Further, the plate 130 and the second supporting unit 122 of the back cover 120 are disposed to be spaced apart from each other with a predetermined interval so that a performance of dissipating heat generated from the display panel 110 in the space may be also provided.

Further, in the display device 100 according to the exemplary embodiment of the present disclosure, the edge area of the back cover 120 excluding a center area where the display panel 110 is supported may be freely bent to improve an exterior appearance of the periphery of the display device 100. Further, the display device 100 according to the exemplary embodiment of the present disclosure includes a structure which absorbs a physical impact from the outside so that deformation and damages may be suppressed.

In the meantime, in the display device 100 according to the exemplary embodiment of the present disclosure, a structure of the plate 130 disposed in the non-display area N/A which is disposed in any one side of the display area A/A in the second direction Y may have a structure which avoids the interference with the printed circuit board disposed on the rear surface of the display panel 110. Such a structure of the plate 130 will be described in more detail with reference to FIG. 3.

Figure 3:
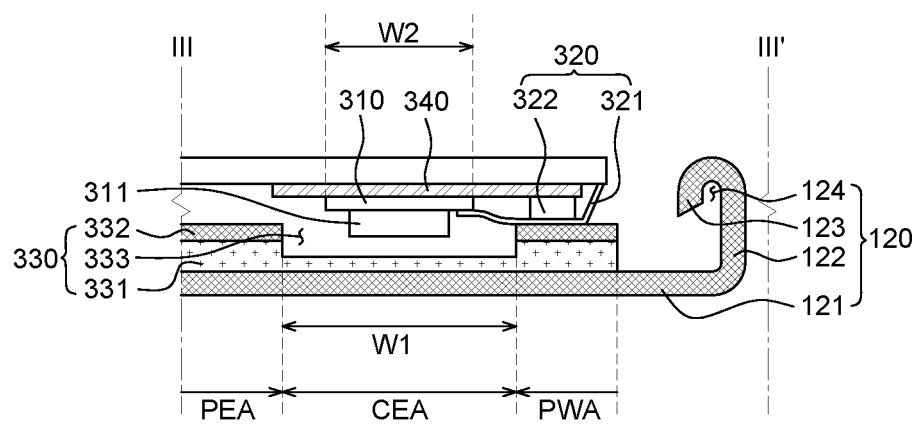
FIG. 3 is a cross-sectional view schematically illustrating a display device taken along the line III-III' of FIG. 1 according to an embodiment of the present disclosure.
Figure 4A:
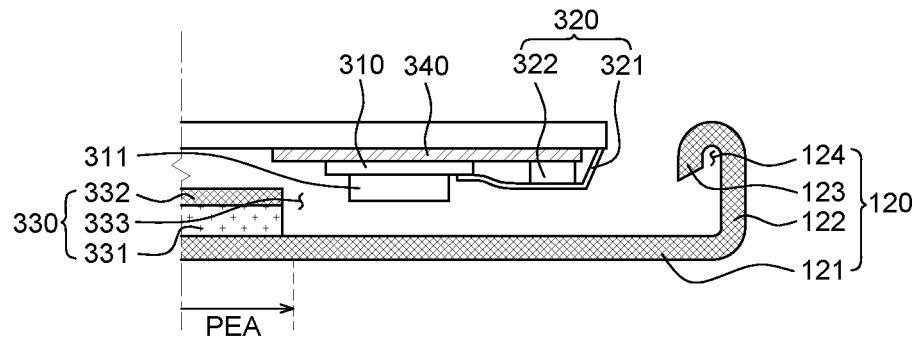
FIGS. 4A to 4B are cross-sectional views schematically illustrating a comparative example of a display device taken along the line III-III' of FIG. 1 according to an embodiment of the present disclosure.
Figure 4B:
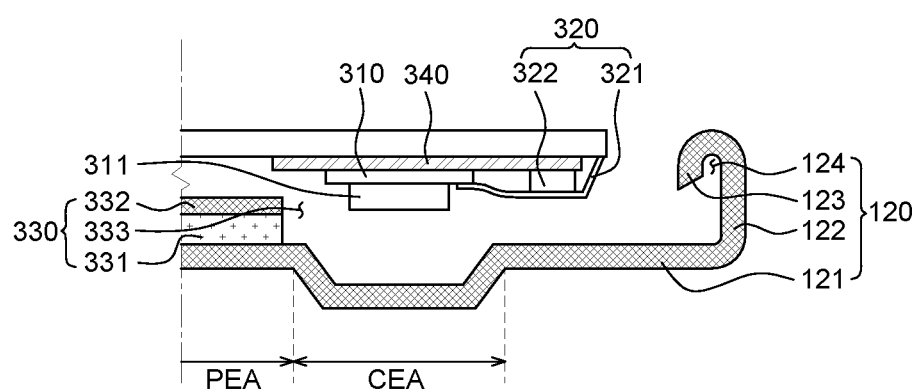

FIG. 3 is a cross-sectional view schematically illustrating a display device taken along the line III-III' of FIG. 1. FIGS. 4A and 4B are cross-sectional views schematically illustrating a comparative example of a display device taken along the line III-III' of FIG. 1.

First, referring to FIG. 3, in the display device 100 according to the exemplary embodiment of the present disclosure, a printed circuit board 310 which is tilted to the rear surface of the display panel 110 to be brought into close contact therewith is disposed in the non-display area N/A of one edge of the display panel 110. The printed circuit board 310 may be electrically connected to the display panel 110 by means of the flexible printed circuit board 320.

On the printed circuit board 310, driving elements 311 which apply a driving control signal to the display panel 110 are disposed. The printed circuit board 310 is attached to the rear surface of the display panel 110 by means of the adhesive member 340. The adhesive member 340 may be a both sided adhesive tape or when the display panel 110 is formed of a metal foil, a rubber magnet may be used. In this case, the printed circuit board 310 and the rubber magnet are adhered with each other using the both sided adhesive tape. When the printed circuit board 310 is attached to the rear surface of the display panel 110 using the rubber magnet, there is an advantage in that when a failure is caused in the printed circuit board 310 or the attachment of the printed circuit board 310 is misaligned, the printed circuit board 310 may be easily detached from the rear surface of the display panel 110 and then reattached.

The flexible printed circuit board 320 electrically connects the display panel 110 to the printed circuit board 310. The flexible printed circuit board 320 may include a base film 321 and a driving circuit chip 322. The base film 321 may be formed of polyimide resin or epoxy resin, or other known materials and may have flexibility. The driving circuit chip 322 outputs a control signal to control the driving of the gate line or the data line disposed in the display panel 110.

The flexible printed circuit board 320 transmits a data signal or a control signal input from the printed circuit board 310 to the display panel 110. That is, the flexible printed circuit board 320 is disposed between the display panel 110 and the printed circuit board 310 to electrically connect the display panel 110 to the printed circuit board 310. More specifically, the flexible printed circuit board 320 bonds an anisotropic conductive film which is a thermosetting resin film containing small conductive particles to one edge of the display panel 110 and the printed circuit board 310 and then performs thermos compression bonding to electrically connect one edge of the display panel 110 and the printed circuit board 310.

The plate 330 may include a core layer 331 which is in contact with the back cover 120, a metal layer 332 on the core layer 331, and a groove 333 which is formed to correspond to the printed circuit board 310 which is tilted toward the rear surface of the display panel 110 to be in close contact therewith. Here, the core layer 331 and the metal layer 332 have been described above with reference to FIGS. 2A to 2F, so that a detailed description of the core layer 331 and the metal layer 332 will be omitted.

The groove 333 may be formed by removing a partial area of the plate 330 corresponding to an area where the printed circuit board 310 and the driving element 311 are disposed on the rear surface of the display panel 110. Further, a width W1 of the groove 333 may be formed with respect to a width W2 of the printed circuit board 310. More specifically, the width W1 of the groove 333 may be larger than the width W2 of the printed circuit board 310. Therefore, the printed circuit board 310 and the driving elements 311 disposed on the printed circuit board 310 may be more stably disposed in the groove 333.

The groove 333 may be formed by removing a part of the core layer 331 and the metal layer 332 corresponding to the position of the printed circuit board 310 disposed on the rear surface of the display panel 110. In the meantime, in FIG. 3, it is illustrated that the groove 333 is formed by removing a part of the core layer 331 and the metal layer 332, but it is not limited thereto and only the metal layer corresponding to the position where the printed circuit board 310 is disposed may be removed. Therefore, the printed circuit board 310 faces the core layer 331 and the electrical interference of the driving elements 311 on the printed circuit board 310 may be avoided.

In the meantime, referring to FIG. 3, the display device 100 having the groove 333 in which the printed circuit board 310 is avoided may include a plate end area PEA, a circuit evasion area CEA, and a plate wall area PWA.

The plate end area PEA, as illustrated in FIGS. 4A and 4B, may be an end area where the plate 330 is disposed when the circuit evasion area CEA is not formed. That is, when the circuit evasion area CEA and the plate wall area PWA are not formed, the plate 330 may be disposed only to the plate end area PEA. However, the display device 100 according to the exemplary embodiment of the present disclosure is not formed only to the plate end area PEA, but may extend from the plate end area PEA to the plate wall area PWA.

The circuit evasion area CEA may correspond to an area where the groove 333 is disposed on the plate 330. When the circuit evasion area CEA is not formed, as illustrated in FIG. 4A, the plate is formed only to the plate end area PEA. Otherwise, in order to dispose the reinforcing member for enhancing the rigidity of the display device, as illustrated in FIG. 4B, a shape of the back cover 120 is deformed to form the circuit evasion area CEA in which the reinforcing member is disposed. However, as illustrated in FIG. 4B, when the circuit evasion area CEA is formed, the exterior appearance of the back cover 120 does not have a flat shape, so that a design quality of the display device may be degraded. Further, as illustrated in FIG. 4A, when the reinforcing member is not provided, the display panel or the printed circuit board may be damaged due to the external impact. However, in the display device 100 according to the exemplary embodiment of the present disclosure, the circuit evasion area CEA is disposed by forming the groove 333 on the plate 330 so that the exterior appearance of the back cover 120 does not need to be deformed. Therefore, the degradation of the exterior design quality of the display device 100 may be suppressed.

The plate wall area PWA is an area extending from the plate end area PEA. As compared with FIGS. 4A and 4B, the plate wall area PWA is further disposed so that the rigidity of the display device 100 according to the exemplary embodiment of the present disclosure may be further enhanced.

The exemplary embodiments of the present disclosure can also be described as follows:

According to an aspect of the present disclosure, a display device may comprise a display panel, a back cover including a first supporting unit which supports a rear surface of the display panel and a second supporting unit which extends from an edge of the first supporting unit to be bent in a vertical direction and is spaced apart from an edge of the display panel and a plate disposed between a front surface of the first supporting unit and the display panel and bonded to the first supporting unit at a position spaced apart from the second supporting unit.

The plate may include a core layer disposed on the front surface of the first supporting unit and including a plastic resin and a metal layer disposed between the core layer and the display panel and formed of the same material as the back cover.

The core layer may be formed by combining any one or more of a carbon fiber, a silicon carbide fiber, an aramid fiber, and a boron fiber with the plastic resin.

The display device may further comprise an adhesive member provided between the rear surface of the display panel and the plate.

The second supporting unit may include a bent edge which is bent from the end of the second supporting unit toward the edge of the display panel.

A space may be provided between the second supporting unit and the bent edge.

The display device may further include an absorbing member which is adhered to the rear surface of the display panel and the first supporting unit between the plate and the bent edge.

The plate may include a supporting edge which is formed by vertically bending both edges of the metal layer to enclose a side of the core layer and is supported by the front surface of the first supporting unit.

The second supporting unit may include a bent edge which is bent from the end of the second supporting unit to be opposite to the edge of the display panel.

According to an another aspect of the present disclosure, a display device may comprise a display panel in which a plurality of pixels are disposed, a printed circuit board bonded to a rear surface of the display panel, a back cover including a first supporting unit which supports the rear surface of the display panel and a second supporting unit which extends from an end of the first supporting unit to be bent in a vertical direction and is spaced apart from an edge of the display panel and a plate between the display panel and the back cover, wherein the plate includes a groove formed in a position corresponding to an area where the printed circuit board is disposed.

The plate may include a core layer disposed on the front surface of the first supporting unit and including a plastic resin and a metal layer disposed between the core layer and the display panel and formed of the same material as the back cover.

The groove may be formed by removing a part of the core layer and the metal layer corresponding to the area where the printed circuit board is disposed.

The printed circuit board may be disposed in the groove and may be disposed to face the core layer.

A width of the groove may be larger than a width of the printed circuit board.

The printed circuit board may be disposed to be tilted toward the rear surface of the display panel.

The second supporting unit may include a bent edge which is bent from the end of the second supporting unit toward the edge of the display panel.

Although the aspects of the present disclosure have been described in detail with reference to the accompanying drawings, it is to be understood that the present disclosure is not limited to those described aspects and various changes and modifications may be made without departing from the scope of the present disclosure. Therefore, the aspects disclosed in the present disclosure are not intended to limit the technical scope of the present disclosure, but to illustrate them. Thus, the technical scope of the present disclosure is not limited by these aspects. It should be understood that the above-described aspects are merely illustrative in all aspects and not restrictive. The scope of the present disclosure should be construed only by the appended claims, and all technical features within the scope of equivalents should be construed as being included in the scope of the present disclosure.

What is claimed is:
1. A display device, comprising:
a display panel in which a plurality of pixels are disposed;

a printed circuit board bonded to a rear surface of the display panel;

a back cover including a first supporting unit which supports the rear surface of the display panel and a second supporting unit which extends from an end of the first supporting unit to be bent in a vertical direction and is spaced apart from an edge of the display panel; and a plate between the display panel and the back cover, wherein the plate includes:

a core layer disposed on a front surface of the first supporting unit and including a plastic resin;

a metal layer disposed between the core layer and the display panel and formed of a same material as the back cover; and a groove formed in a position corresponding to an area where the printed circuit board is disposed.

2. The display device according to claim 1, wherein the groove is formed by removing a part of the core layer and the metal layer corresponding to the area where the printed circuit board is disposed.

3. The display device according to claim 2, wherein the printed circuit board is disposed in the groove and is disposed to face the core layer.

4. The display device according to claim 1, wherein a width of the groove is larger than a width of the printed circuit board.

5. The display device according to claim 1, wherein the printed circuit board is disposed to be tilted toward the rear surface of the display panel.

6. The display device according to claim 1, wherein the second supporting unit includes a bent edge which is bent from the end of the second supporting unit toward the edge of the display panel.

\* \* \* \* \*